United States Patent [19]

Nishi

[11] Patent Number: 4,897,553

[45] Date of Patent: Jan. 30, 1990

[54] PROJECTION EXPOSURE APPARATUS

[75] Inventor: Kenji Nishi, Kawasaki, Japan

[73] Assignee: Nikon Corporation, Tokyo, Japan

[21] Appl. No.: 356,654

[22] Filed: May 17, 1989

Related U.S. Application Data

[63] Continuation of Ser. No. 164,946, Mar. 7, 1988, abandoned.

[30] Foreign Application Priority Data

Mar. 13, 1987 [JP] Japan .................................. 62-58658

[51] Int. Cl.[4] ............................................ G01N 21/86
[52] U.S. Cl. ..................................... 250/548; 356/401
[58] Field of Search ................ 250/548, 557; 356/399, 356/400, 401

[56] References Cited

U.S. PATENT DOCUMENTS

| | | | |
|---|---|---|---|
| 4,153,371 | 5/1979 | Koizumi et al. | 356/400 |
| 4,636,626 | 1/1987 | Hazama et al. | 250/557 |
| 4,650,983 | 3/1987 | Suwa | 250/548 |
| 4,677,301 | 6/1987 | Tanimoto et al. | 250/548 |
| 4,766,309 | 8/1988 | Kudo | 250/548 |

Primary Examiner—David C. Nelms
Attorney, Agent, or Firm—Shapiro and Shapiro

[57] ABSTRACT

A projection exposure apparatus for projecting a pattern on a mask illuminated by exposure light onto a substrate placed on a movable stage through a projection optical system is disclosed. A fiducial mark is provided at a predetermined position on the stage, a mark pattern is provided at a predetermined position on the mask and an illuminating optical system directs light of a wavelength equal to that of the exposure light to illuminate the fiducial mark. A position detector photoelectrically detects the mark pattern and the image of the fiducial mark formed on the mask through the projection optical system and detects the relative position of the mask and the stage. A device for interchanging the substrate on the stage with another substrate, and controller for controlling both of the position detector and the substrate interchanging device is used so that the position detector terminates the detection of position during the substrate interchange by the substrate interchanging device.

23 Claims, 6 Drawing Sheets

PROJECTION EXPOSURE APPARATUS this is a continuation application of Ser. No. 164,946 filed Mar. 7, 1988, now abandoned.

BACKGROUND OF THE INVENTION

1. Field of the Invention

This invention relates to a projection exposure apparatus for projecting a pattern image onto a substrate to be exposed by the use of a projection optical system, and in particular to an exposure apparatus having a position detecting device for effecting position detection when a pattern on a pattern substrate such as a reticle is transferred onto a substrate to be exposed.

2. Related Background Art

An exposure apparatus of this type generally has, as a position detecting device, a device for effecting the detection of the position of a projection optical system for pattern transfer in a direction orthogonal to the optic axis and a device for effecting the detection of the position of the projection optical system in the direction of the optic axis. The device for effecting the former position detection, as disclosed in U.S. Pat. No. 4,677,301 has one position detecting device using a sensitizing wavelength and another position detecting device using a non-sensitizing wavelength differing from the sensitizing wavelength of a wafer. A fiducial mark or a reference mark provided on a stage has been detected with the aid of the two position detecting devices by running the stage, and by monitoring the position coordinates of the stage, and the relative distance of the detection positions of the two position detecting devices (the base line) has been measured from the amount of movement of the stage, the fiducial mark of the stage has been aligned with the mark of a reticle by said one position detecting device, and a wafer mark has been detected by said another position detecting device, and the stage has been moved by said relative distance (the base line), whereby alignment of the reticle mark and the wafer mark has been indirectly effected relative to said one position detecting device.

However, in this apparatus of the prior art, only the measurement of said relative distance (the base line measurement) is effected when the reticle is placed onto a reticle holder, and in the sequence of wafer alignment and exposure, confidence has been put in the aforementioned relative distance measured during the reticle setting, whereafter the reticle has not been observed.

More particularly, in the reticle alignment sequence, a reticle is placed onto the reticle holder and the reticle is aligned in directions, X, Y and θ, whereafter measurement of the magnification is effected and the reticle is focused to the fiducial mark of the stage, and the relative distance of the two position detecting devices is measured. Also, in the wafer exposing sequence, a wafer is placed onto a wafer holder and the wafer is global-aligned in directions X, Y and θ. Thereafter, alignment of each chip is effected by the use of a non-sensitizing wavelength, and the wafer is exposed after the correction of the relative distance.

In the prior art as described above, the process of observing the reticle and the fiducial mark of the stage at the same time through the same optical system is carried out only when the reticle is placed onto the reticle holder, and this has led to the problem that the detection of the position of the wafer has been subject to an offset due to a variation with time in the optical system and the accuracy of the position detection has suffered.

On the other hand, effecting the measurement of the relative distance of the two position detecting devices (used for the measurement of the magnification or the measurement of the base line)(which is the detection of the position in a plane orthogonal to the exposure optic axis) or the measurement of the in-focus state (which is the detection of the position in the direction of the exposure optic axis) results in a reduced throughput and therefore has not been practiced in the past.

SUMMARY OF THE INVENTION

Accordingly, the present invention has been made in view of such problems peculiar to the prior art and an object thereof is to provide an exposure apparatus which does not depend on a variation with time in the optical system and which is free of a reduction in throughput and is high in the accuracy of position detection.

Another object of the present invention is to provide an exposure apparatus which can accomplish the detection of at least the in-focus position during the interchange of a substrate to be exposed.

To achieve the above objects, according to the present invention, in the delivery position of a substrate to be exposed, the fiducial mark of a stage is disposed so as to be capable of being observed by a position detecting device and the design is such that the detection of the in-focus state and the position of the stage can be accomplished during the interchange of the substrate to be exposed.

Also, according to an embodiment of the present invention, the measurement of the relative distance of two position detecting devices and the measurement of the in-focus position are effected when an exposed substrate to be on the stage is interchanged with an unexposed substrate to be exposed. The measured relative distance is added as an amount of correction during the alignment of each chip of the substrate to be exposed, and the measured in-focus position is used to render a pattern substrate and the substrate to be exposed conjugate with each other.

According to the present invention, the influence of a variation with time in the apparatus by heat or the like is decreased to thereby improve the accuracy of position detection and the processing ability is not reduced.

Further objects, features and effects of the present invention will become more fully apparent from the following detailed description taken in conjunction with the accompanying drawings.

DESCRIPTION OF THE PREFERRED EMBODIMENTS

Figure 1:
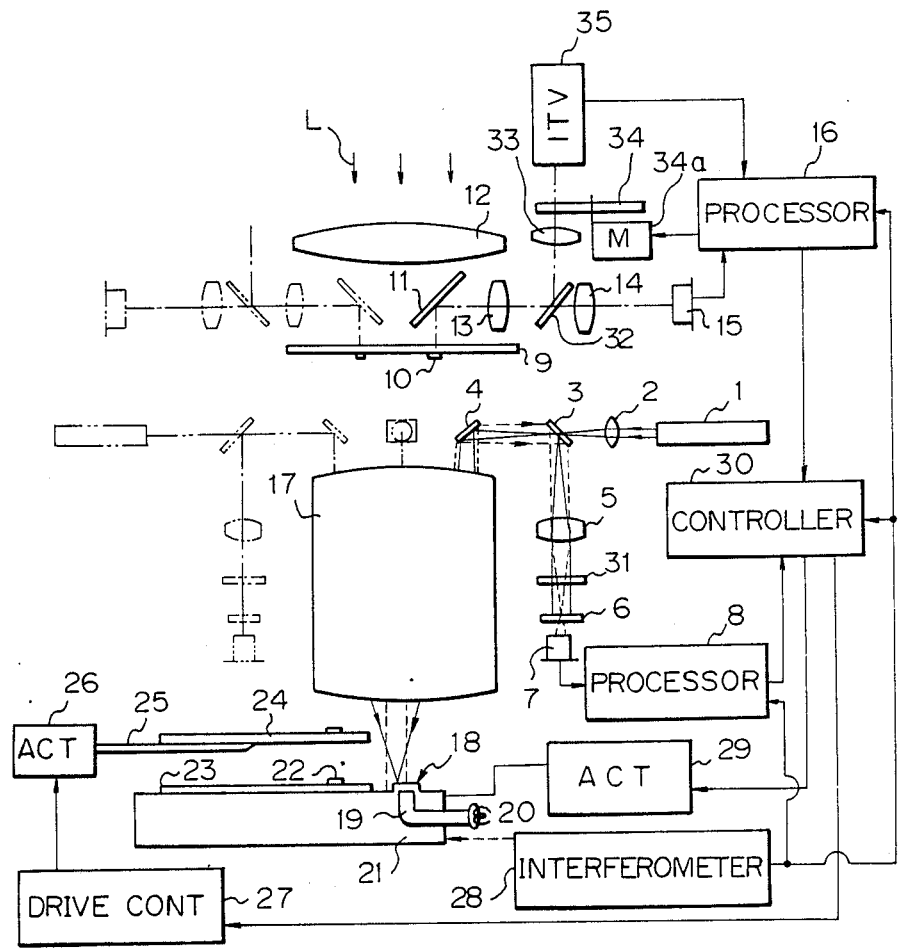
FIG. 1 shows the construction of an embodiment of the present invention and also shows a state in which the position of a fiducial mark is measured by a wafer alignment optical system.
Figure 2:
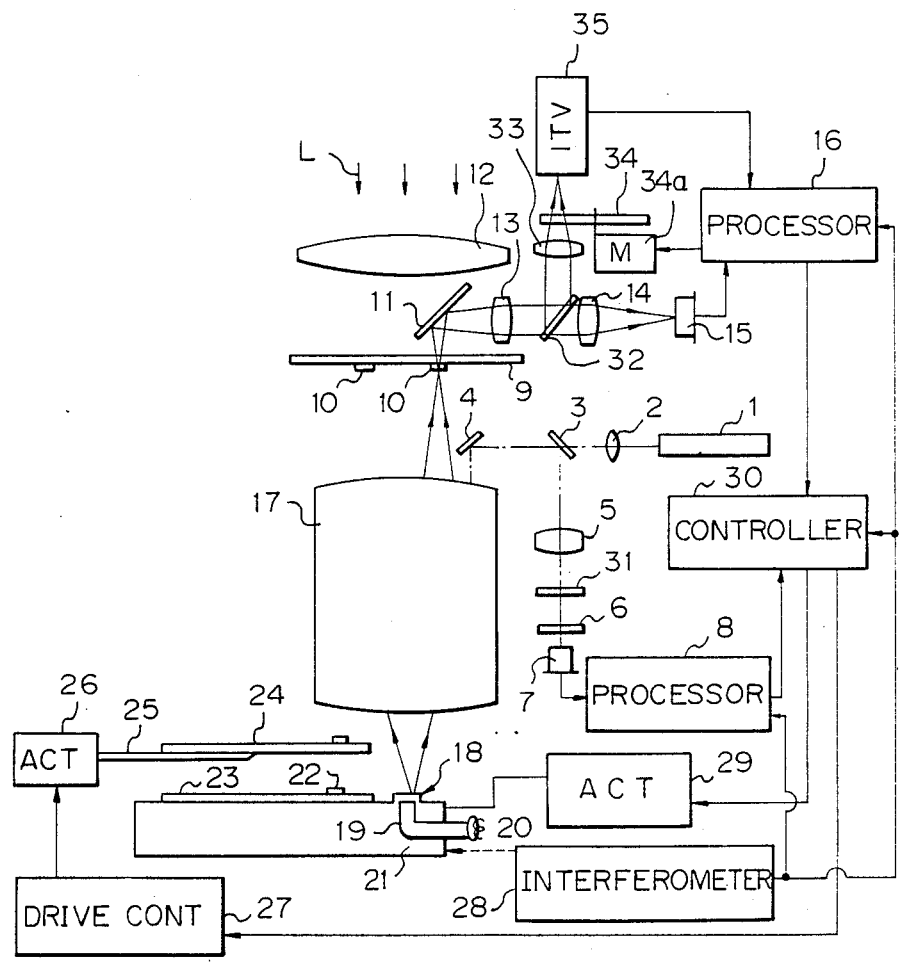
FIG. 2 shows a state in which the positions of a reticle mark and the fiducial mark are measured in the embodiment shown in FIG. 1.

Referring to FIGS. 1 and 2 which show the construction of an embodiment of the present invention, there is shown a state in which a stage is placed at a position whereat a wafer on the stage (an exposed wafer) is to be replaced with a wafer to be subsequently exposed (an unexposed wafer) and a fiducial mark area on the stage is in the detection area of first position detecting devices using a non-sensitizing wavelength and second position detecting devices using light of a wavelength equal to a sensitizing wavelength. Actually, three sets of first position detecting devices and two sets of second position detecting devices are disposed, but only one set each is shown by solid lines and the other sets are schematically shown by phantom lines.

Figure 3:
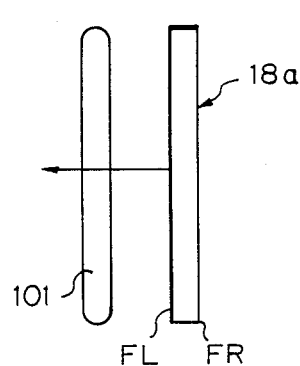
FIG. 3 is an illustration showing a state in which the fiducial mark scans a light spot.
Figure 4:
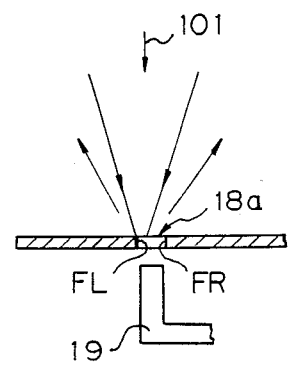
FIG. 4 is a cross-sectional view of the fiducial mark portion.
Figure 5A:
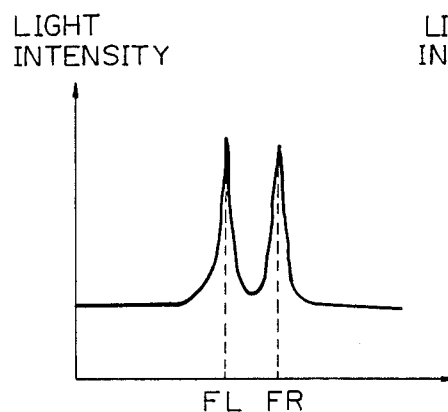
FIG. 5A shows a waveform obtained in the position measurement by a first position detecting device shown in FIG. 1.

FIG. 1 shows the state when the first position detecting such as the device 1–7 and 31′ using a non-sensitizing wavelength for detecting the position of the wafer 23 on the stage 21′ are detecting the mark area 18 on the stage 21 and the wafer 23 on the stage 21 (the exposed wafer) is being replaced with the wafer 24 to be subsequently exposed (the unexposed wafer) by a wafer arm 25 and an actuator 26. A beam (non-sensitizing wavelength) emitted from a laser tube 1 is made into a band-like beam by a cylindrical lens 2 (usually a beam expander is provided between the laser tube 1 and the cylindrical lens 2, but it is omitted in FIG. 1) and passes through a half-mirror 3, whereafter it is deflected by a mirror 4. The laser beam thus deflected forms three band-like laser spots near three sets of fiducial marks provided in the mark area 18 of the stage 21, by a projection lens 17. Each fiducial mark is comprised of a pair of slits orthogonal to each other, and the disposition of each slit and each laser spot will be described later. FIG. 3 shows shapes of a laser spot 101 and a slit 18a, one of the slits formed in one fiducial mark, scanning the laser spot. A controller 30 outputs a drive command signal to an actuator 29 of the stage so that the slit 18a scans the laser spot 101. As a result, the slit 18a moves in the direction of the arrow in FIG. 3 and scans the laser spot 101. The slit 18a is formed in the stage 21, as shown in FIG. 4, and scattered light (broken lines in FIG. 1) from the edges FL and FR of the slit pass through the projection lens 17 and are deflected by the mirror 4 and the half-mirror 3, and pass through a cylindrical lens 5 and further through a wavelength selecting filter 31, whereafter they arrive at a spatial filter 6. Regularly reflected light is attenuated by the optical filter 6 and only the scattered light from the edges FL and FR is detected by the detector 7. The wavelength selecting filter 31 also attenuated the light from a light source 20 which has passed through the fiducial mark from below it. The light from the light source 20 is set to a wavelength equal to the exposure wavelength and is directed to below the mark area 18 by an optical fiber 19. A waveform processor 8 effects sampling and position analysis in accordance with the command of the controller 30 at a pulse interval generated by an interferometer 28 which monitors the amount of movement of the stage 21. When the slit 18a scans the laser spot 101, a signal corresponding to the light intensity of the scattered light as shown in FIG. 5A is obtained from the detector 7. The peak positions of this signal correspond to the edges FL and FR of the slit 18a. Accordingly, the position of the laser spot 101 can be determined by counting the pulses from the interferometer 28 corresponding to the two peak positions.

Figure 6:
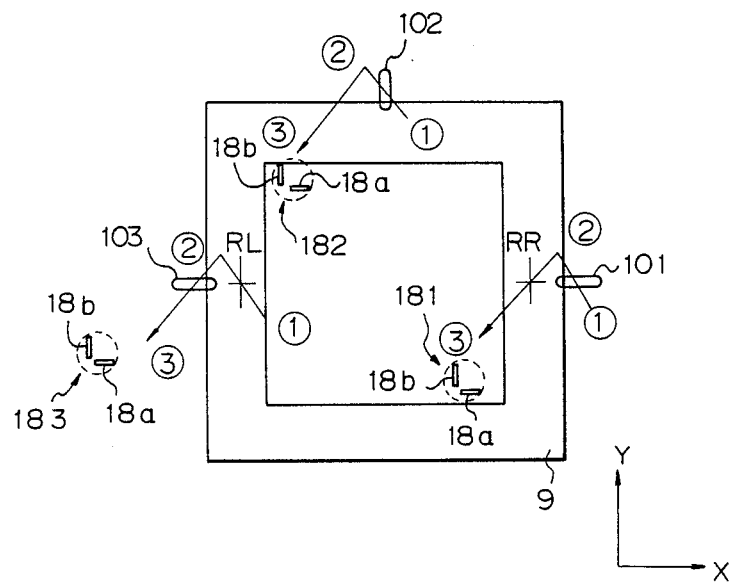
FIG. 6 is an illustration showing the movement situation of a stage relative to a reticle.

FIG. 6 shows the state when the mark area 18 is seen from above a mask (reticle) 9 through the projection lens 17. In the mark area 18, there are provided three fiducial marks (horizontal alignment marks) 181, 182 and 183 each having a pair of slits 18a and 18b provided in directions X and Y. Also, two laser spots 101 and 103 extending in direction X and a laser spot 102 extending in direction Y, as shown in FIG. 6, are formed in the mark area 18 by the projection systems 1–4 of the three sets of first position detecting devices 1–7.

By the scanning of the stage 21, the three fiducial marks 181, 182 and 183 obliquely scan the laser spots 101, 102 and 103 respectively corresponding thereto, as indicated by route ① - ② - ③ in FIG. 6.

In this case, when the slits 18a of the marks 181 and 183 in direction X scan the laser spots 101 and 103, respectively, and the slit 18b of the mark 182 in direction Y scans the laser spot 102, the signals as shown in FIG. 5A are output from the respective detectors 7 of the first position detecting devices.

On the other hand, the illuminating light from the light source 20 having the same wavelength as illuminating light L for exposure (or the illuminating light from the exposure light source) passes through the optical fiber 19 and illuminates the three fiducial marks from below the mark area 18, and the light having passed through the slits 18a and 18b forms the images of the respective slits on the reticle 9 by the projection lens 17. This light, as shown in FIG. 2, passes through the reticle 9 is deflected by the mirrors 11 of the two sets of second position detecting devices (only one set is shown in FIG. 2), and passes through an objective lens 13, a half-mirror 32 and an objective lens 14 and is received by a detector 15. Sampling and position analysis are effected by a waveform processor 16.

Figure 5B:
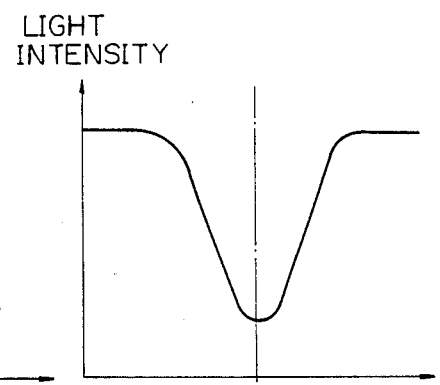
FIG. 5B shows a waveform obtained in the position measurement by a second position detecting device shown in FIG. 2.

Describing with reference to FIG. 6, when the mark 181 or 183 does not overlap the reticle mark RR or RL on the reticle 9, the quantity of light of the mark 181 or 183 is detected by the detector 15 as shown in FIG. 5B, and when the mark 181 or 183 overlaps the reticle mark RR or RL, the light from the mark 181 or 183 is intercepted by the reticle mark RR or RL and the quantity of light reaching the detector 15 becomes almost nil. Accordingly, the position of the stage in which the output of the detector 15 assumes a minimum value (FIG. 5B) is the position in which the reticle mark RR or RL overlaps the mark 181 or 183. In FIG. 6, as described above, there are three light emitting type fiducial marks 181, 182 and 183 as horizontal alignment marks, and the design is such that relative distance measurement and magnification measurement which will be described later can be accomplished by two cycles of scanning (①-② and ②-③) of the stage 21. The laser spots 101, 102 and 103 are laser spots for alignment of the wafer (alignment spots), and the laser spot 101 is for alignment of the wafer in direction Y, the laser spot 102 is for alignment of the wafer in direction X, and the laser spot 103 is for alignment of the wafer in direction θ.

The relative position of the stage 21 and the wafer 23 is detected by the stage 21 being moved and the fiducial mark and the wafer mark 22 being scanned by the laser spot of non-sensitizing wavelength light output from the light source 1 of the first position detecting devices. The relative distance on the surface of the stage 21 between the second position detecting devices 20, 19, 11, 13, 32, 14, 15, 16, 30, 28, 29 using a sensitizing wavelength and the first position detecting devices 1–8, 28–31 using a non-sensitizing wavelength can be measured by finding the difference between the stage coordinates value intermediate of the peaks FL and FR of FIG. 5A and the coordinates value of the lowest level of FIG. 5B.

Figure 7:
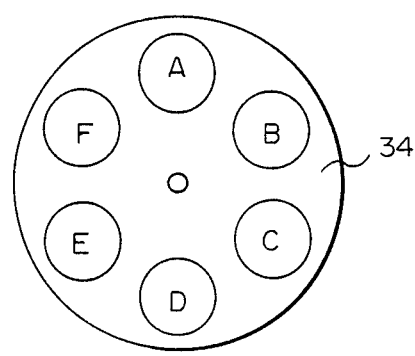
FIG. 7 is an enlarged plan view of an optical path length changing member used for focus measurement in FIG. 1.
Figure 8:
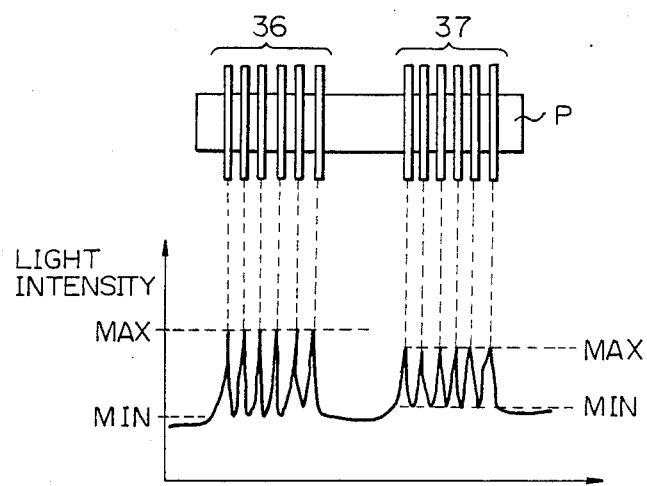
FIG. 8 illustrates a waveform obtained by a focus mark and an image pickup tube.

FIG. 7 is an enlarged plan view of an optical path length changing member 34 shown in FIGS. 1 and 2 (in FIG. 2, only one set of first position detecting devices and only one set of second position detecting devices are shown. This optical path length changing member 34 has transparent plane parallel glass plates A, B, C, D, E and F of different glass thicknesses, and the position thereof can be sampled by a rotary encoder, not shown, coupled to a motor 34a. Also, an image pickup tube 35 provided rearwardly of the optical path length changing member 34 observes the images of a fiducial mark 36 for focusing provided discretely on the mark area 18 as shown in FIG. 8 and a reticle mark 37 for focusing provided discretely on the reticle through an $ objective lens 33 at a time when the stage 21 moves the marks 181, 182 and 183 to the position ③ of FIG. 6. The area P of FIG. 8 is the image pickup surface of the image pickup tube 35. Also, the fiducial mark 36 for focusing can be replaced by the marks 181 and 183, and the reticle mark 37 for focusing can be replaced by RR and RL of the reticle mark 10. However, if as in the present embodiment, the two marks are discrete marks and the marks 36 and 37 for focusing are patterns narrower in width than the fiducial mark and the reticle mark, the accuracy of detection of the in-focus position will be improved.

Figure 9:
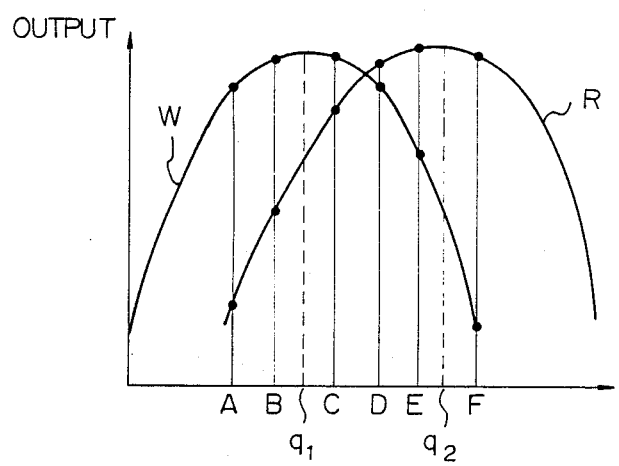
FIG. 9 is a graph showing the contrast (light intensity) of the picked-up focus mark.

The waveform processor 16 area-samples the signal of the image pickup tube 35 as soon as the optical path length changing member 34 rotates and the transparent glass plates A, B, C, D, E and F pass across the optical path, and obtains a signal as shown in FIG. 8 for a transparent glass plate and effects the detection of the contrast of the marks 36 and 37 for focusing. Thereby, the contrast (vertical axis) for each glass thickness (horizontal axis) is obtained and a graph of curve W for the fiducial mark 36 and curve R for the reticle mark 37 as shown in FIG. 9 is prepared, and by detecting the vertex thereof, the best in-focus positions $q_1$ and $q_2$ of the fiducial mark 36 for focusing and the reticle mark 37 for focusing are found and these are converted on the reticle 9 and the mark area 18, thereby determining each focus value. The surface of the mark area 18 is at the same level as the surface of the wafer 23.

As regards the focusing operation, the objective lens 13 is first moved on the basis of said focus values so that the reticle mark 37 for focusing may be conjugate with the image pickup surface of the image pickup tube 35 (as a result, the detector 15 also becomes conjugate with the reticle mark 37 for focusing, i.e., the reticle mark 10), whereafter the stage 21 is moved up and down by a vertically moving device, not shown, whereby the reticle 9 and the surface of the mark area 18 are made conjugate with each other with respect to the projection lens 17.

A reticle illuminating lens 12 is for directing the light from an exposure light source, not shown, to the reticle 9, whereby the pattern of the reticle 9 is reduction-projected onto the chips on the wafer 23 by the projection lens 17 (but in FIGS. 1 and 2, the wafer 23 is not in the exposure position). The reference numeral 10 designates reticle marks RR and RL.

Figure 10:
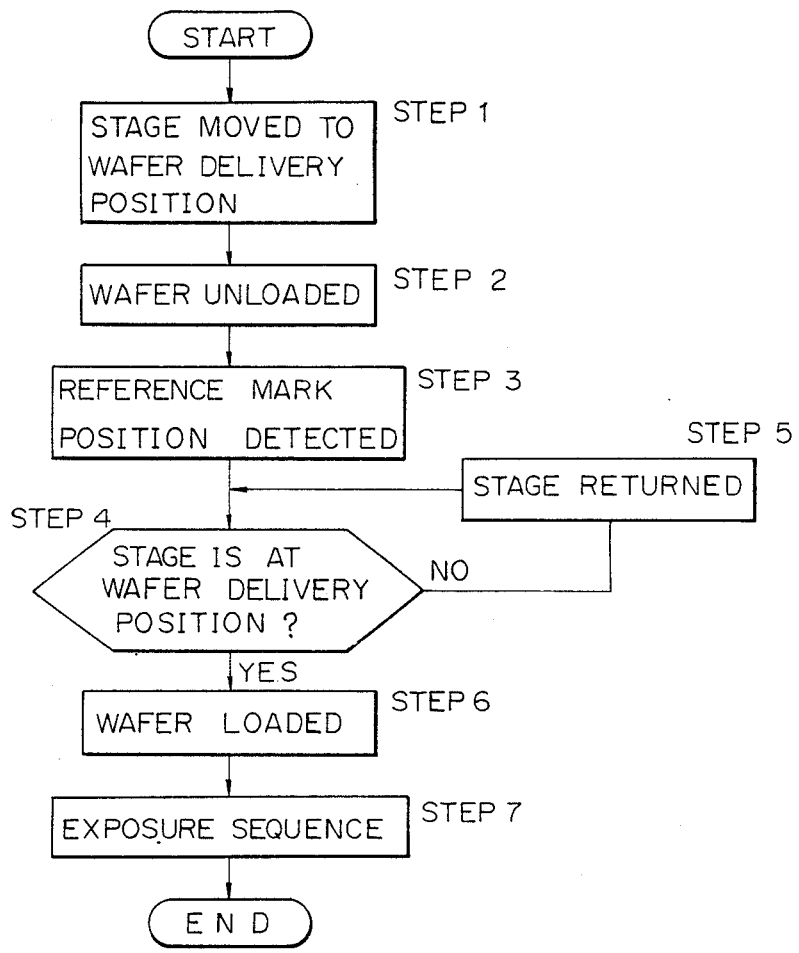
FIG. 10 is a flow chart for illustrating the operation of a controller in FIG. 1.

The operation of the controller will now be described with reference to FIG. 10. When the exposure of each chip of the wafer 23 is completed, the controller 30 inputs to the stage actuator 29 a movement command signal for moving the stage 21 to the delivery position for the wafer 23, and when it detects the arrival of the stage 21 at the delivery position by the signal from the interferometer 28 monitoring the coordinates of the stage 21, it stops the stage 21 (step 1). Then, it inputs a command signal for wafer interchange to the drive controller 27 and as a result, the arm actuator 26 drives the wafer arm 25, thereby unloading the exposed wafer 23 from the stage to interchange it with an unexposed wafer 24 (step 2). The controller 30 utilizes the time from after the exposed wafer 23 is unloaded from the stage 21 until the unexposed wafer 24 is placed on the stage 21 to effect the aforementioned relative position detection and in-focus position detection (step 3). That is the controller 30 inputs to the stage actuator 29 a signal for operating the stage 21 as indicated by the route ①-②-③ of FIG. 6, by a signal indicative of the fact that the exposed wafer 23 has been delivered to a wafer removing arm, not shown, and this arm has been moved to a predetermined position. The controller 30 also rotates the motor 34a for driving the optical path length changing member 34. As a result, both waveform processors 8 and 16 perform the aforementioned operations, and the information of the aforementioned relative position and in-focus position is input to the controller 30. When such measurement information is input, the controller 30 confirms by the information from the interferometer 28 whether the stage 21 is in the delivery position (step 4), and if the stage is not in the delivery position, the controller 30 inputs a command signal to the stage actuator 29 so as to return the stage 21 to the delivery position by the route ③-① of FIG. 6 and returns the stage 21 to the delivery position (step 5).

If the stage 21 is in the delivery position, the unexposed wafer 24 is placed onto the stage 21 by the wafer arm 25 (step 6), and by the signal from an unshown detector of the stage 21 or an unshown position detector of the wafer arm 25, the controller 30 knows that the unexposed wafer 24 has been placed onto the stage 21, and enters a predetermined exposure sequence (step 7). That is, the controller effects step feeding so that the stage 21 is sequentially moved by a predetermined procedure and alignment and exposure are repeated for each chip.

As described above, the sequence of the delivery of the wafers 23 and 24 and the sequence of the relative position detection and in-focus position detection are effected keeping pace with each other. However, where the time from after the step 2 at which the exposed wafer 23 is unloaded from the stage 21 is terminated until the step 6 at which the unexposed wafer 24 is loaded onto the stage is shorter than the time until the sequence of the relative position detection and in-focus position detection of the step 3 is terminated, the operation of loading the unexposed wafer 24 can be started after the stage is returned by the signal indicative of the termination of the sequence of the relative position detection and in-focus position detection.

Also, in the above-desCribed embodiment, the image pickup tube 35 observes the reticle mark 37 for focusing and the fiducial mark 36 for focusing at the same time, but if the design is such that a reflecting mirror is put in and out between the reticle 9 and the projection lens 17 and the fiducial mark 36 for focusing can be observed substantially from on the optic axis of the projection lens, the in-focus state of the vicinity of the center o the projection lens which is most liable to be affected by a temperature change and is most necessary in projection can be known. Where the in-focus detection only is effected at step 3, it is not necessary to move the stage 21 as indicated by the route ① - ② - ③ of FIG. 6, but the stage may be rectilinearly moved so that the fiducial mark 181 or 182 may overlap RR or RL of the reticle mark 10. Also, if the focus mark 36 is disposed on the stage 21 so that in the wafer delivery position, the image of the focus mark 36 lies on the image pickup surface P of the image pickup tube 35, the unexposed wafer 24 can be placed onto the stage 21 (step 6) immediately after the focus detection.

I claim:

1. A projection exposure apparatus comprising:
   a projection optical system disposed between a first plane and a second plane for forming an image of a pattern arranged in said first plane onto an exposure area in said second plane;
   a movable stage adapted to support a substrate and provided with a fiducial mark at a predetermined position thereon;
   detection mean for viewing a reference mark arranged in said first plane and for viewing said fiducial mark through said projection optical system to detect the position of said reference mark relative to said fiducial mark;
   means for moving said stage between an exposure position at which said substrate is carried into said exposure area and a retracted position at which said substrate is carried outside of said exposure area;
   said fiducial mark being arranged so that said fiducial mark may be viewed by said detection means through said projection optical system when said stage is at said retracted position;
   means for interchanging said substrate on said stage with another substrate when said stage is at said retracted position; and
   control means for controlling said detection means, said stage moving means and said interchanging means so that said detection means detects said relative position and said interchanging means interchanges said substrates when said stage is at said retracted position.

2. A projection exposure apparatus according to claim 1, wherein said detection means includes a photoelectric conversion element for detecting variation in quantity of light caused by an image of said fiducial mark formed on said first plane by said projection optical system scanning said reference mark in response to movement of said stage and overlapping said reference mark, a position detecting optical system for directing images of said fiducial mark and said reference mark to said photoelectric conversion element, and waveform processing means for finding a desired value of the output of said photoelectric conversion element.

3. A projection exposure apparatus according to claim 1, wherein said detection means includes an illumination system adapted to illuminate said fiducial mark.

4. A projection exposure apparatus according to claim 3, wherein said fiducial mark includes a pair of slits disposed perpendicularly to each other, and said illumination system includes an optical fiber provided on said stage so as to illuminate said slits from the side opposite said projection optical system.

5. A projection exposure apparatus according to claim 1, wherein said apparatus comprises further detection means including an image pickup element, an imaging optical system for causing said reference mark and an image of said fiducial mark formed on said first plane by said projection optical system to be imaged on an image pickup surface of said image pickup element, and an optical path length changing means for changing the length of an optical path of said imaging optical system between said first plane and said image pickup element to detect the relative position of said first plane and said fiducial mark in the direction of the optic axis of said projection optical system extending between said planes, with respect to light of an exposure light wavelength.

6. A projection exposure apparatus according to claim 1, wherein said detection means includes a photoelectric conversion element for detecting variation in quantity of light caused by an image of said fiducial mark formed on said first plane by said projection optical system overlapping said reference mark in conformity with movement of said stage, and wherein said apparatus comprises further detection means for detecting the relative position of said first plane and said stage in a direction perpendicular to the optic axis of said projection optical system extending between said planes, said further detection means including an image pickup element for picking up images of said reference mark and said fiducial mark, an imaging optical system for causing images of said reference mark and said fiducial mark to be formed on a light receiving surface of said image pickup element, and optical path length changing means for changing the length of an optical path of said imaging optical system between said first plane and said image pickup element to detect the relative position of said reference mark and said fiducial mark in the direction of said optic axis with respect to light of an exposure light wavelength.

7. A projection exposure apparatus according to claim 6, wherein said fiducial mark and said reference mark each comprises an orthogonal pattern having a pair of lines orthogonal to each other.

8. A projection exposure apparatus according to claim 1, wherein said detection means includes an illumination system adapted to illuminate said fiducial mark with light of an exposure wavelength, said apparatus further comprising substrate position detecting means including a substrate mark provided at a predetermined position on said substrate supported on said stage, means for directing light of a non-exposure wavelength through said projection optical system to form a light spot that is scanned by said fiducial mark and said substrate mark in response to movement of said stage, and a detecting optical system for receiving light from said fiducial mark and said substrate mark to detect the relative position of said stage and said substrate supported on said stage.

9. A projection exposure apparatus according to claim 8, wherein said fiducial mark is formed by a pair of slits orthogonal to each other, and said illumination system includes an optical fiber provided on said stage to direct illuminating light so as to project images of said slits onto said first plane through said projection optical system.

10. A projection exposure apparatus according to claim 1, wherein said control means controls said stage moving means so that an image of said fiducial mark formed by said projection optical system scans said reference mark when said stage is at said retracted position.

11. A projection exposure apparatus according to claim 1, wherein said control means controls said stage moving means so that an image of said fiducial mark formed by said projection optical system scans said reference mark after said interchanging means removes the first-mentioned substrate from said stage.

12. A projection exposure apparatus according to claim 1, wherein said apparatus comprises further detection means for detecting focusing condition of said image of said fiducial mark formed on said first plane.

13. A projection exposure apparatus comprising:
a projection optical system disposed between a first plane and a second plane for forming an image of a pattern arranged in said first plane onto an exposure area in said second plane;
a movable stage adapted to support a substrate and provided with a fiducial mark at a predetermined position thereon;
detection means for viewing a reference mark arranged in said first plane and said fiducial mark through said projection optical system to detect the position of said reference mark relative to said fiducial mark;
means for viewing said fiducial mark through said projection optical system to detect the position of said fiducial mark relative to a further mark in said second plane;
means for moving said stage between an exposure position at which said substrate is carried into said exposure area and a retracted position at which said substrate is carried outside of said exposure area;
said fiducial mark being arranged so that said fiducial mark may be viewed by said detection means through said projection optical system when said stage is at said retracted position;
means for interchanging said substrate on said stage with another substrate when said stage is at said retracted position; and
control means for controlling said detection means, said stage moving means and said interchanging means so that said detection means detects said relative position and said interchanging means interchanges said substrates when said stage is at said retracted position.

14. A projection exposure apparatus according to claim 13, wherein said detection means includes a first light source supplying light having a first wavelength and a second light source supplying light having a second wavelength differing from said first wavelength.

15. A projection exposure apparatus according to claim 13, wherein said detection means produces information with respect to a pair of detecting positions.

16. A projection exposure apparatus comprising:
a projection optical system disposed between a first plane and a second plane for forming an image of a pattern arranged in said first plane onto an exposure area in said second plane;
a movable stage adapted to support a substrate and provided with a fiducial mark at a predetermined position thereon;
means for projecting light of a first wavelength through said projection optical system onto said fiducial mark, for detecting light returned by said fiducial mark through said projection signal system, and for producing a first outpout signal in response to said returned light;
means for transmitting light of a second wavelength through said fiducial mark and through said projection optical system for forming an image of said fiducial mark in said first plane;
means for detecting overlapping of said image of said fiducial mark and an image of a reference mark disposed in said first plane for producing a second output signal;
means for moving said stage between an exposure position at which said substrate is carried into said exposure area and a retracted position at which said substrate is carried outside of said exposure area;
said fiducial mark being disposed on said stage so as to receive light of said first wavelength and light of said second wavelength when said stage is at said retracted position, whereby said output signals may be produced while said stage is at said retracted position;
means for interchanging said substrate on said stage with another substrate when said stage is at said retracted position;
control means for controlling said stage moving means to scan said fiducial mark with said light of said first wavelength and to overlap said images of said fiducial mark and said reference mark while said stage is at said retracted position; and
signal processor means responsive to said output signals for determining the position of said reference mark relative to said fiducial mark in a direction perpendicular to the optical axis of said projection optical system extending between said planes.

17. A projection exposure apparatus according to claim 16, wherein a further mark is provided on the substrate supported on the stage disposed to receive light of said first wavelength, and wherein said apparatus comprises means responsive to light of said first wavelength from said fiducial mark and from said further mark for determining the position of said substrate supported on said stage relative to said stage.

18. A projection exposure apparatus according to claim 16, wherein said means for producing said second output signal comprises a photodetector that receives said images of said fiducial mark and said reference mark, and wherein said apparatus further comprises means operative when said stage is at said retracted position for adjusting the focus of said images so that the images received by said photodetector are in-focus.

19. A projection exposure apparatus according to claim 18, wherein said adjusting means includes means responsive to images of marks in said first plane and on said stage.

20. A projection exposure apparatus according to claim 19, wherein the last-mentioned marks comprise, respectively, a first set of parallel lines in said first plane and a second set of parallel lines on said stage.

21. A projection exposure apparatus comprising:
a projection optical system disposed between a first plane and a second plane for forming an image of a pattern arranged in said first plane onto an exposure area in said second plane;
a movable stage adapted to support a substrate and provided with a fiducial mark at a predetermined position thereon;
detection means for viewing a reference mark arranged in said first plane and for viewing an image of said fiducial mark through said projection optical system to detect the focusing of said marks;
means for moving said stage between an exposure position at which said substrate is carried into said exposure area and a retracted position at which said substrate is carried outside of said exposure area;
said marks being disposed so that said images may be viewed by said detection means when said stage is at said retracted position;
means for interchanging said substrate on said stage with another substrate when said stage is at said retracted position; and
control means for controlling said detection means, said stage moving means and said interchanging means so that said detection means detects the focusing of said marks and said interchanging means interchanges said substrates when said stage is at said retracted position.

22. A projection exposure apparatus according to claim 21, wherein said detection means has optical path length changing means for changing the length of an optical path between said first plane and said detection means.

23. A projection exposure apparatus according to claim 21, wherein said marks comprise, respectively, a first set of parallel lines in said first plane and a second set of parallel lines on said stage.

* * * * *